(12) United States Patent
Matsuoka et al.

(10) Patent No.: US 7,664,811 B2
(45) Date of Patent: Feb. 16, 2010

(54) APPARATUS USING SAMPLING CAPACITORS

(75) Inventors: Akihiko Matsuoka, Kanagawa (JP); Kentaro Miyano, Osaka (JP); Katsuaki Abe, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/295,939

(22) PCT Filed: Apr. 6, 2007

(86) PCT No.: PCT/JP2007/057778

§ 371 (c)(1),
(2), (4) Date: Oct. 3, 2008

(87) PCT Pub. No.: WO2007/116974

PCT Pub. Date: Oct. 18, 2007

(65) Prior Publication Data

US 2009/0051422 A1 Feb. 26, 2009

(30) Foreign Application Priority Data

Apr. 7, 2006 (JP) .............................. 2006-105974

(51) Int. Cl.
*G06G 7/02* (2006.01)

(52) U.S. Cl. .................................................... 708/819

(58) Field of Classification Search .................. 708/819
See application file for complete search history.

(56) References Cited

U.S. PATENT DOCUMENTS

| 6,192,386 | B1 | 2/2001 | Shinde |
| 6,963,732 | B2 | 11/2005 | Muhammad et al. |
| 7,003,276 | B2 | 2/2006 | Muhammad et al. |
| 7,272,187 | B2 | 9/2007 | Shimizu |
| 7,539,721 | B2 * | 5/2009 | Belveze et al. .............. 708/819 |
| 2002/0172170 | A1 | 11/2002 | Muhammad et al. |
| 2003/0050027 | A1 | 3/2003 | Muhammad et al. |

FOREIGN PATENT DOCUMENTS

| JP | 56-071324 A | 6/1981 |
| JP | 2003-317026 A | 11/2003 |
| JP | 2006-066178 A | 3/2006 |

* cited by examiner

*Primary Examiner*—Tan V Mai
(74) *Attorney, Agent, or Firm*—Greenblum & Bernstein, P.L.C.

(57) ABSTRACT

A switched capacitor type filter apparatus includes sampling capacitors and has a steep characteristic with a small number of taps. The filter apparatus includes positive polarity selecting switches, negative polarity selecting switches, positive read-out switches, negative polarity read-out switches, and a timing control unit. Thus, it is possible to read out a negative charge by controlling the polarity upon write-in and the polarity upon read-out to be identical or different. Accordingly, it is possible to set a negative coefficient as a filter weighting coefficient. This configuration causes a finite impulse filter (FIR) to have a steep characteristic.

20 Claims, 6 Drawing Sheets

500
APPARATUS USING SAMPLING CAPACITORS

TECHNICAL FIELD

The present invention relates to a filter apparatus for band-limiting signals subjected to time-discretization by sampling processing, using capacitive load including capacitors.

BACKGROUND ART

Presently, studies are conducted for circuit schemes for performing digital signal processing of high-frequency signals accompanying progress in digital signal processing technology. As an example, there is a technique of performing discrete-signal processing on a received signal using switched capacitors. Moreover, as another example, a technique of signal processing featuring a filtering function of sampling and band-limiting a received signal at the same time, is proposed.

A conventional filter apparatus has a voltage-to-current conversion section converting sampling signals to current and a set of capacitors formed with a plurality of switched capacitors. This filter apparatus charges sampling signals in the capacitors in a fixed order and collectively extracts charge from a plurality of capacitors, thereby providing working effects including a mixing effect by down sampling and a filtering effect by gathering and averaging a plurality of capacitors (for example, see patent document 1). FIG. 1 shows the conventional filter apparatus disclosed in patent document 1.

The filter apparatus in FIG. 1 charges signal 21, which is sampled received signals 20 converted to current, into capacitors C, in a predetermined order, through switches controlled by control signals 31, 32 and 33, from DCU 34 that controls timings. Then, the filter apparatus collectively picks up a plurality of charges and converts them to voltage, to acquire output signal 26.

The filter apparatus is able to change the weights of filter coefficients by changing the ratio of capacitance between a plurality of capacitors from which charge is collectively picked up, thereby providing a filtering effect of different characteristics from a simple decimation filter.

Patent Document 1: United States Patent Application Publication No. 2003/0050027 Specification (FIG. 5)

DISCLOSURE OF INVENTION

Problems to be Solved by the Invention

However, given that the above-described conventional configuration controls filtering characteristics according to the ratio of capacitance between the capacitors, there are problems that it is difficult to set negative coefficients as filter weighting coefficients and that it is difficult to realize a filter having steep characteristics with a small number of capacitors.

It is therefore an object of the present invention to provide a filter apparatus of improved frequency characteristics, that makes it possible to use negative coefficients for filter weighting coefficients by controlling the polarity of capacitor charge upon feeding charge and upon picking up charge.

Means for Solving the Problem

The filter apparatus of the present invention adopts a configuration including: a radio frequency conversion section that converts a radio frequency signal to current; a plurality of sampling capacitors that accumulate the current as charge; a reading section that reads voltage from the sampling capacitors; a ground connection switch that selectively connects one of two terminals of each sampling capacitor to a common ground; and a reading selecting switch that selectively connects the one of the two terminals of each sampling capacitor to the reading section.

Advantageous Effect of the Invention

According to the present invention, the polarities of sampling capacitors accumulating charge can be flexibly controlled by controlling switches, so that it is possible to use negative weighting coefficients for filter coefficients, and this results in providing a filter apparatus having steep and flexible characteristics.

BEST MODE FOR CARRYING OUT THE INVENTION

Now, an embodiment of the present invention will be described in detail with reference to the accompanying drawings.

Figure 1:
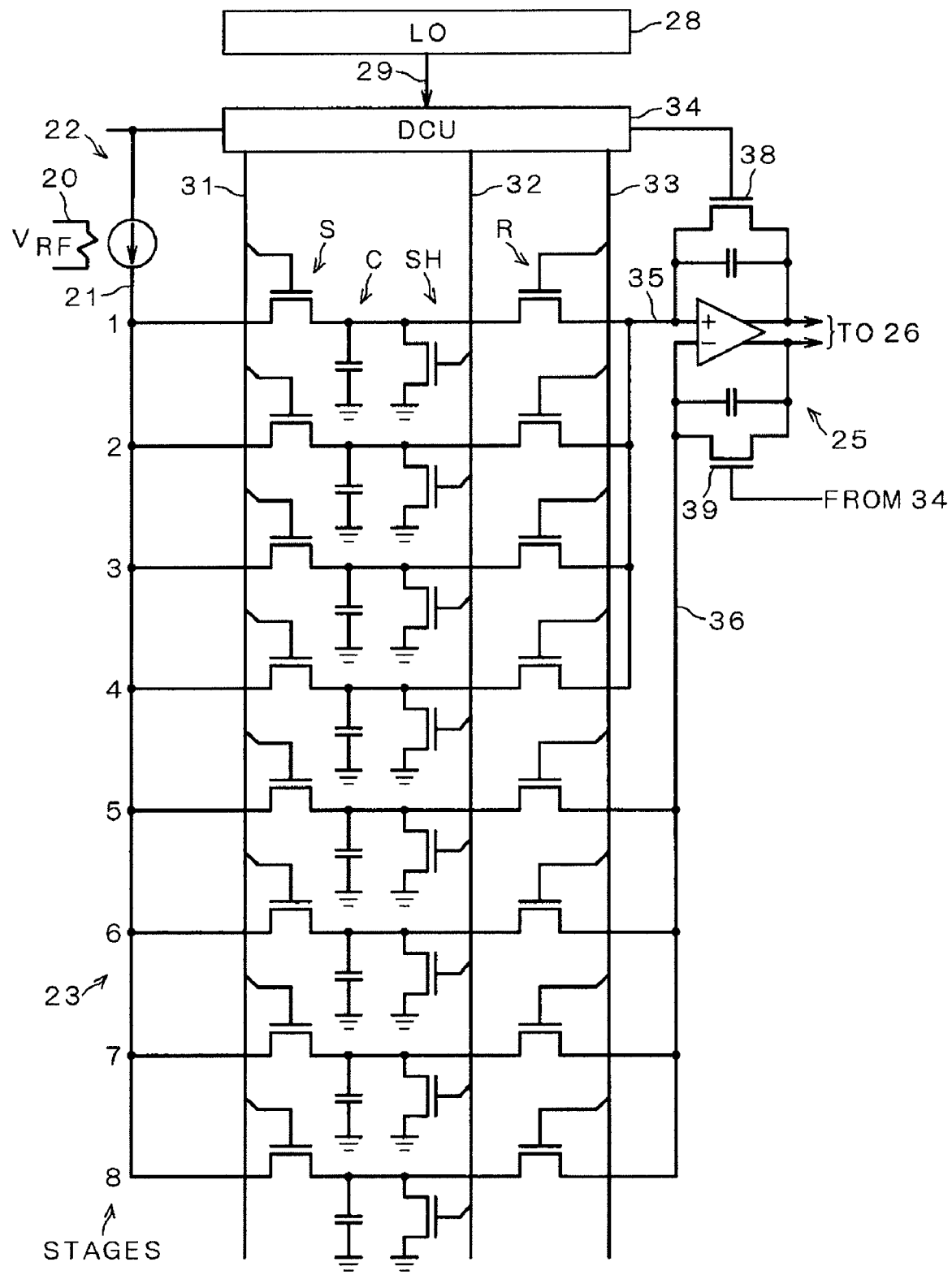
FIG. 1 shows a configuration diagram of a conventional filter apparatus.
Figure 2:
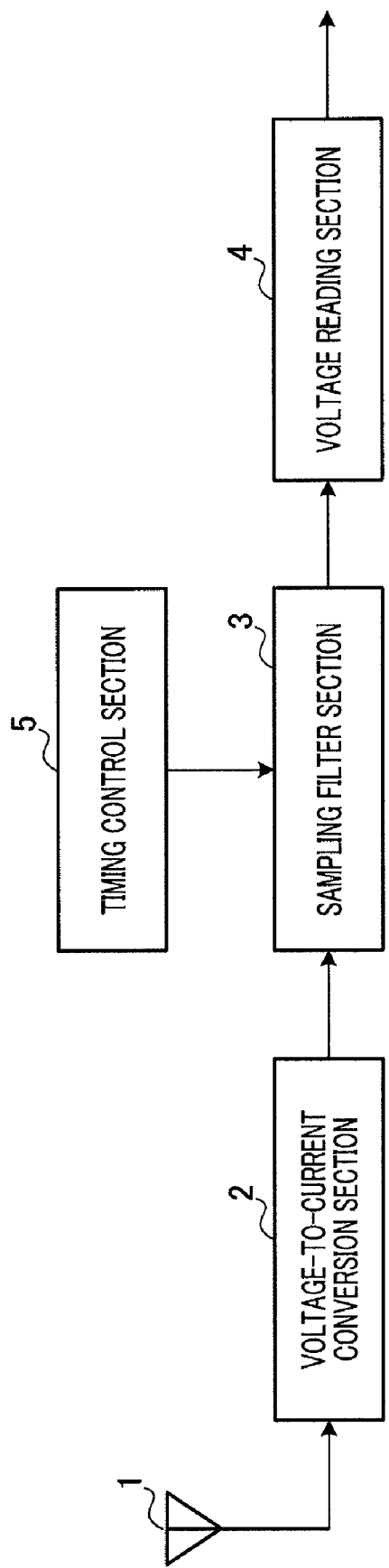
FIG. 2 is a block diagram showing the configuration of the radio receiving apparatus according to the embodiment of the present invention.

FIG. 2 is a configuration diagram of the radio receiving apparatus according to the embodiment of the present invention.

The radio receiving apparatus in FIG. 2 has antenna 1 carrying out radio communication, voltage-to-current conversion section 2, sampling filter section 3, voltage reading section 4 and timing control section 5, controls the operations of the switches in sampling filter section 3 by control signals from timing control section 5, and realizes the sampling and filtering operations of interest.

Figure 3:
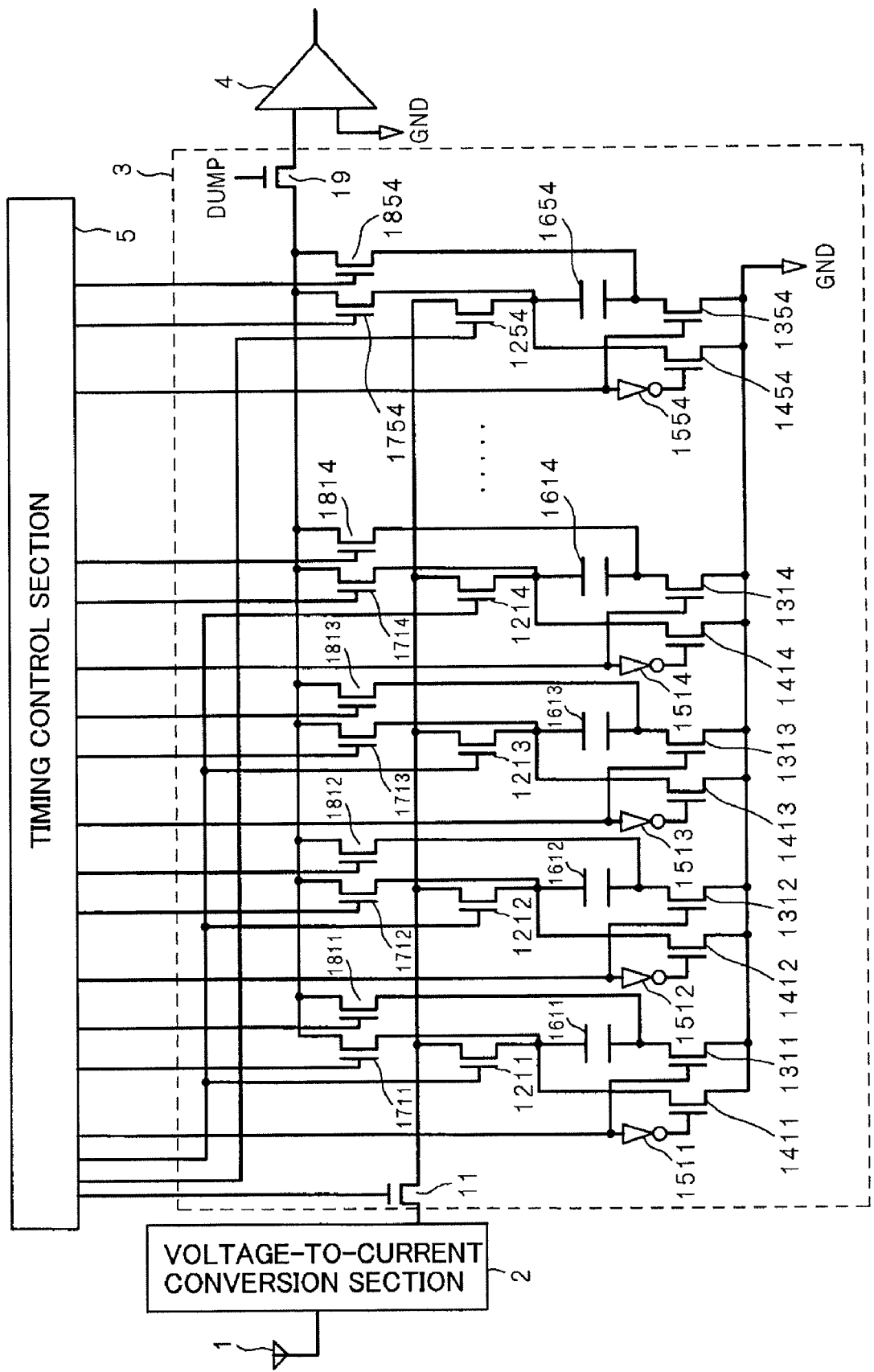
FIG. 3 shows connections of the configuration of the filter apparatus according to the embodiment.

FIG. 3 shows the internal configuration of sampling filter section 3. Sampling filter section 3 has sampling switch 11, charging capacitor selecting switches 1211 to 1254, positive polarity selecting switches 1311 to 1354, negative polarity selecting switches 1411 to 1454, inverting circuits 1511 to 1554, sampling capacitors 1611 to 1654, positive polarity reading switches 1711 to 1754, negative polarity reading switches 1811 to 1854 and charge reading switch 19. The operations of the switches are controlled based on the control signals from timing control section 5.

Sampling filter section 3 reads out the charge of sampling capacitors 1611 to 1654 by converting the current from sampling capacitors 1611 to 1654 to voltage using charge reading switch 19 and voltage reading section 4.

A configuration will be explained below as a specific example for realizing an FIR filter, in which the number of taps is four and in which the coefficients of tap 1 and tap 2 are negative.

Sampling capacitors 1611 to 1654 form five sets of sampling capacitors, having the same ratio of capacitance as the ratio of the absolute values of the tap coefficients of the FIR filter. To be more specific, the first capacitor set is formed with sampling capacitors 1611 to 1614, and, the second to the fifth sampling capacitor sets are formed with sampling capacitors 1621 to 1624 (not shown), in the same manner, sampling capacitors 1631 to 1634 (not shown), sampling capacitors 1641 to 1644 (not shown), sampling capacitors 1651 to 1654, respectively. That is, the total number of capacitors is twenty.

As such, according to the present embodiment, a plurality of sampling capacitors are grouped into sets of sampling capacitors, and charge is accumulated per sampling capacitor set. By this means, by accumulating the signals at sampling times in a plurality of capacitors, a filter that is configured to require the sampling signal of a single time a plurality of times, like a convolution filter, is realized.

Moreover, according to the present embodiment, the clock frequencies of sampling switch 11 and charge reading switch 19 are the same, and decimation is not performed.

Furthermore, according to the present embodiment, the number of sampling capacitors forming a set of sampling capacitors equals the number of taps of the FIR filter. This makes it possible to configure an FIR filter easily.

Moreover, according to the present embodiment, the ratio of capacitance between the sampling capacitors forming a set of the sampling capacitors equals the absolute value of the ratio of weighting coefficients of the tap coefficients of the FIR filter. By this means, controlling the polarities of the sampling capacitors easily realizes the FIR filter having arbitrary weighting coefficients.

Next, the operations of the present embodiment will be described. First, the operation of feeding charge, that is, the operation for accumulating charge, will be described. At sampling time 1, charge is fed into four sampling capacitors 1611 to 1614 forming the first set. At next sampling time 2, charge is fed into four sampling capacitors 1621 to 1624 forming the second set (not shown). Hereinafter, charge is fed into the third to fifth sampling capacitor sets as time passes. At the next time after charge is fed into the fifth sampling capacitor set, charge is fed into the first sampling capacitor set. Hereinafter, charge is fed into the sampling capacitor sets regularly.

Next, the operation for reading out charge, that is, the operation for picking up charge, will be described. At sampling time 1, from each of the four sets except for the first set that is feeding charge, one capacitor that corresponds to the tap associated with the sampling time is selected, and charge is read out. To be more specific, capacitor 1651 corresponding to tap 1 of the FIR filter is selected from the fifth sampling capacitor set fed one time earlier, capacitor 1642 corresponding to tap 2 of the FIR filter is selected from the fourth sampling capacitor set fed two times earlier, capacitor 1633 corresponding to tap 3 of the FIR filter is selected from the third sampling capacitor set fed three times earlier, and capacitor 1624 corresponding to tap 4 of the FIR filter is selected from the second sampling capacitor set fed four times earlier.

Here, the input signal is inputted in descending order of the tap number in the FIR filter. Moreover, negative coefficients are set for tap 1 and tap 4, so that the read-out is inverted between capacitor 1624 and capacitor 1651.

Figure 4:
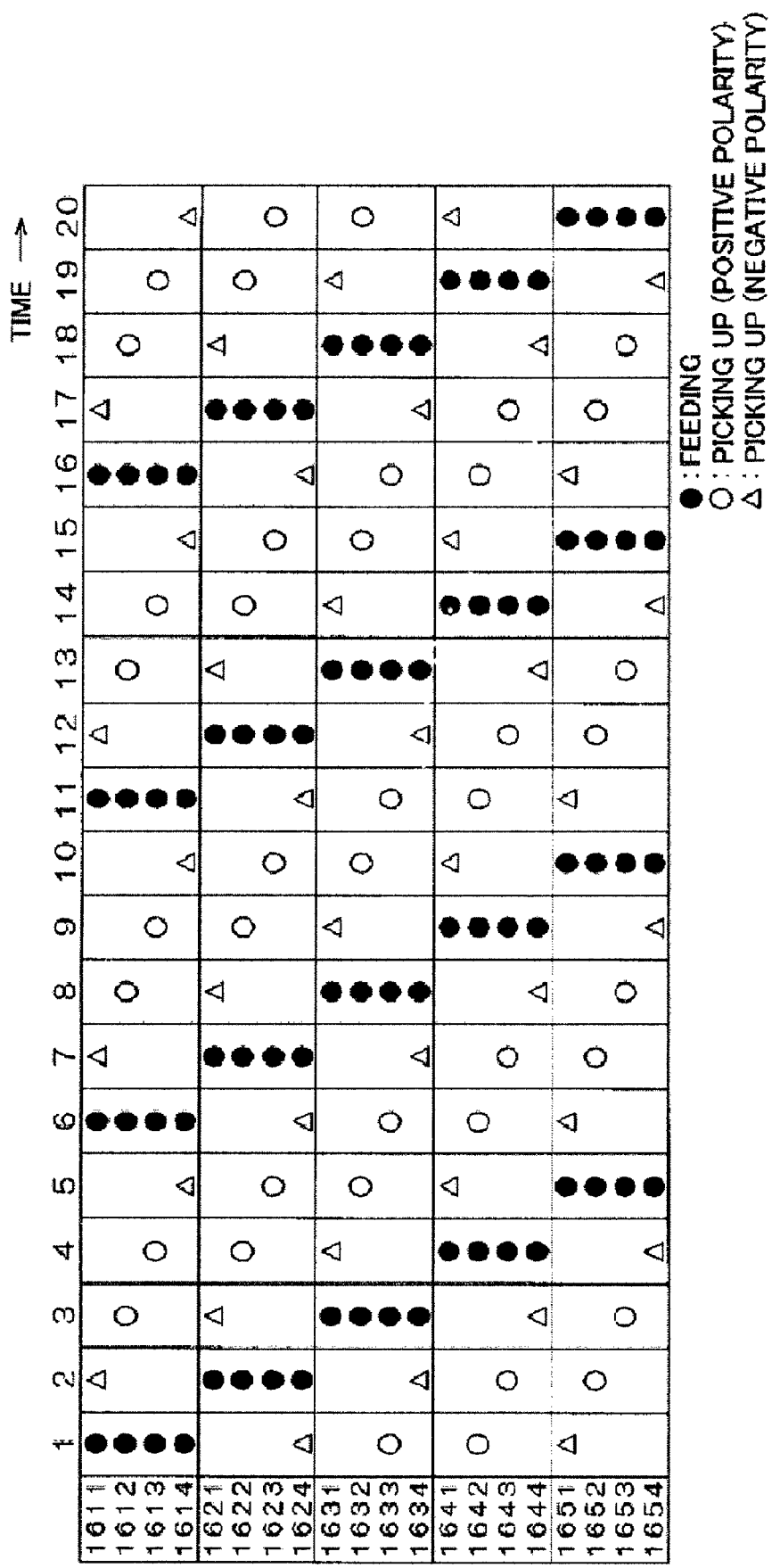
FIG. 4 illustrates timings of feed and read-out according to the embodiment.

Charge is read out in the same manner at time 2. FIG. 4 shows a table where feed and read-out at the sampling times are summarized. As described above, at every sampling time, feed is performed for a set of sampling capacitors while read-out is performed for the capacitors selected from each one of the rest of the sampling capacitor sets.

As can be seen in the present embodiment, the number of sampling capacitor sets is one larger than the number of sampling capacitors forming one sampling capacitor set. In this way, according to the present embodiment, it is possible to read out charge from a plurality of sampling capacitors in a single read-out and change the combinations of a plurality of selected sampling capacitors between the time of accumulating charge and the time of reading out charge. By this means, according to the present embodiment, it is possible to prevent a set of sampling capacitors from accumulating and picking up charge at the same time. Moreover, it is possible to collectively pick up the charge accumulated at different times.

In addition, according to the present embodiment, a plurality of sampling capacitors selected in a single read-out are configured to be selected one at a time per sampling capacitor having accumulated charge. According to the present embodiment, this makes it possible to collectively pick up charge multiplied by the weighting coefficients of different times and accumulated, and realize an FIR filter.

Figure 5:
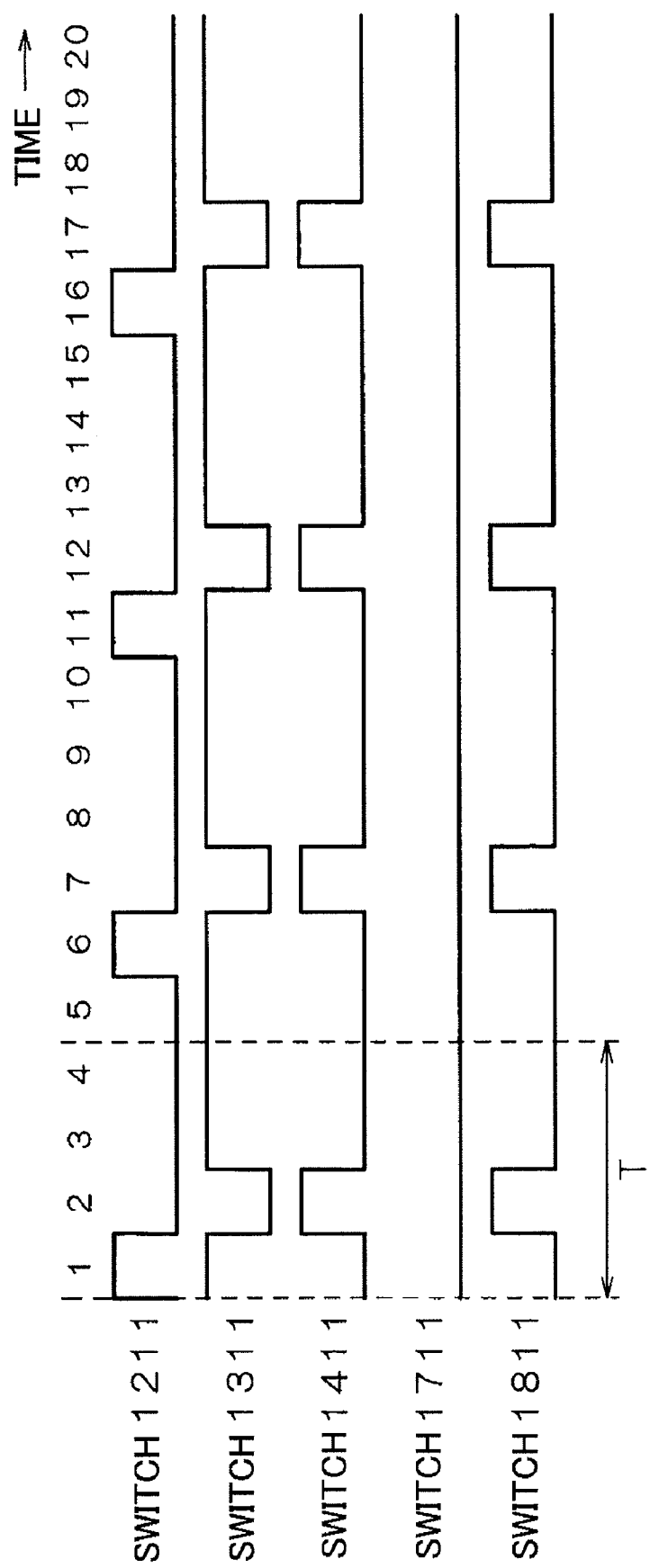
FIG. 5 illustrates the timing control signals according to the embodiment.

Next, FIG. 5 shows the control signals of switches 1211, 1311, 1411, 1711 and 1811 related to sampling capacitor 1611, which corresponds to tap 1 of the first sampling capacitor set. Here, as shown in FIG. 4, the negative polarities are picked up from capacitor 1611.

The times are the same as in FIG. 4 in this case. First, at time 1, switch 1211 is connected and charge is fed into sampling capacitor 1611. Next, at time 2, switches 1411 and 1811 are connected and switches 1311 and 1711 are released, and the charge of sampling capacitor 1611 is inverted and read out. The number of taps is four, so that, a cycle one larger than this, that is, a cycle matching five taps, is the cycle the same operations repeat.

According to the configuration and steps of the present embodiment described above, the polarity of charge can be inverted between the time of feeding charge and the time of reading out charge, so that it is possible to set negative coefficients for sampling capacitors 1611 and 1614 corresponding to tap 1 and tap 4 in the 4-tap FIR filter performed in sampling filter section 3.

Figure 6:
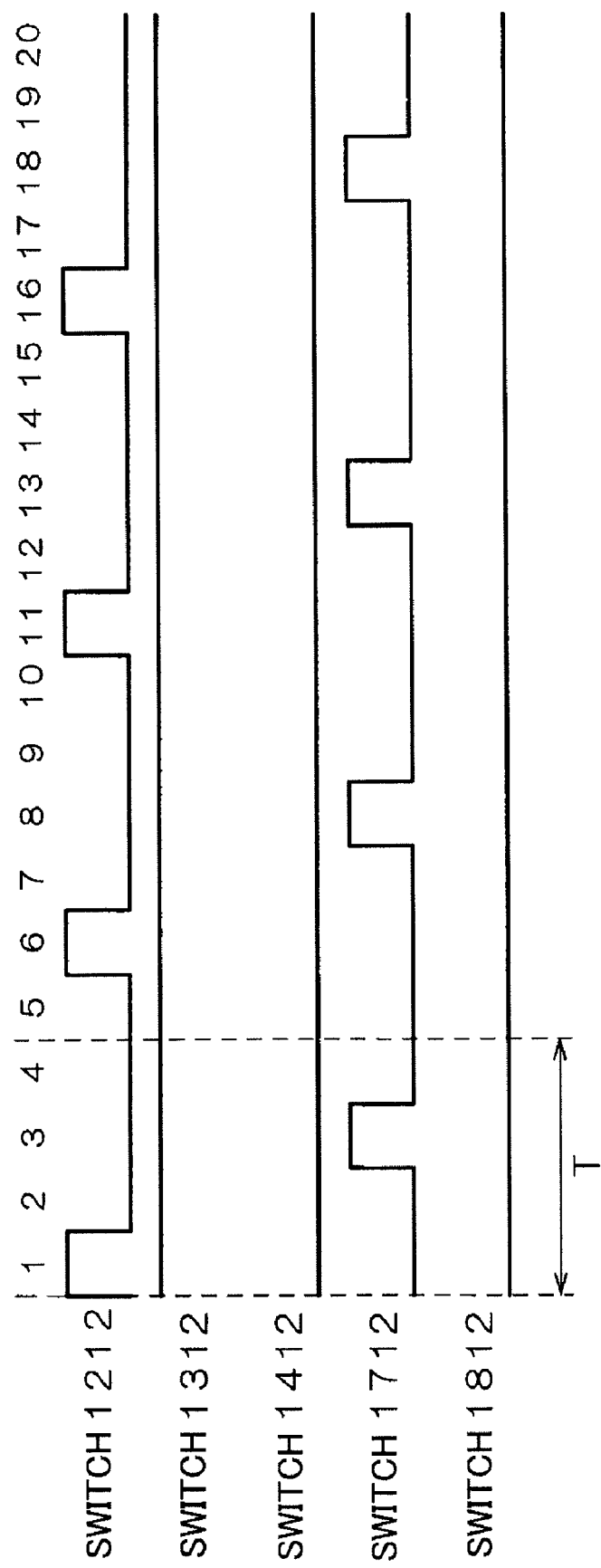
FIG. 6 illustrates the timing control signals according to the embodiment.

Next, FIG. 6 shows the control signals of switches 1212, 1312, 1412, 1712 and 1812 related to sampling capacitor 1612 corresponding to tap 2. Here, as shown in FIG. 4, the positive polarities are picked up from capacitor 1612.

The times are the same as in FIG. 4 in this case. First, at time 1, switch 1212 is connected and charge is fed into sampling capacitor 1612. Next, at time 2, switch 1212 is released. Next, at time 3, by connecting switch 1712, the charge of sampling capacitor 1612 can be read.

This allows filter characteristics in sampling filter section 3 to be steep, and realizes a filter circuit preferable in high speed time-discretization processing.

Although a configuration has been described with the present embodiment where charge is inverted when read out, a configuration where charge is inverted when fed is also possible.

Moreover, although an FIR has been explained as an example where the number of taps is four and where tap 1 and tap 4 have negative weighting coefficients, the number of taps and whether the weighting coefficients are positive or negative, maybe arbitrary. In this case, if the number of taps is N, the number of sampling filters forming one sampling filter set may be N and the number of sampling filter sets may be N+1. This makes it possible to collectively pick up charge multiplied weighting coefficients at different times and accumulated, so that an FIR filter can be realized.

Although a case has been explained with an example where decimation is not performed, the present invention does not limit the ratio of decimation is 1.

If the ratio of decimation is N, the ratio of operation speed between input and output to/from sampling filter section 3 changes, so that it is necessary to form a capacitor set of N times. Moreover, decimation may be performed before starting the FIR filter.

As described above, according to the present embodiment, voltage-to-current conversion section (RF conversion section) 2, a plurality of sampling capacitors 1611 to 1654 accumulating current as charge, reading section 4 reading out voltage from sampling capacitors 1611 to 1654, ground connection switches 1311 to 1354 and 1411 to 1454 selectively connecting one of two terminals in sampling capacitors 1611 to 1654 to common ground GND and reading selecting switches 1711 to 1754 and 1811 to 1854 selectively connecting any of two terminals in sampling capacitors 1611 to 1654 to reading section 4 are provided.

In this way, controlling the switches allows the polarities of sampling capacitors 1611 to 1654 accumulating charge to control flexibly by the signals from timing control section 5, so that it is possible to set negative coefficients as filter coefficients. As a result, filter characteristics improve.

Further, controlling the polarities of sampling capacitors 1611 to 1654 by the signals from timing control section 5 can easily realize an FIR filter having arbitrary weighting coefficients.

By forming at least one of ground connection switch and reading selecting switch as MEMS (Micro Electro Mechanical Systems) switch, it is possible to realize a compact and low-loss switch, so that a filter with outstanding characteristics can be realized.

Moreover, the sampling capacitor sets may each have the same total capacitance of sampling capacitors, so that the load seen from the current source can be kept constant.

Moreover, the complexity of switching control can be reduced by forming sampling capacitor sets using the same number of sampling capacitors.

Moreover, the design of the sampling capacitor may be easy by forming the sampling capacitor sets using the sampling capacitors of the same amount of capacitance. Furthermore, by selecting sampling capacitors to be used, the tolerance for variation improves.

Incidentally, according to the present embodiment, the individual sampling capacitor sets are formed with the same number of sampling capacitors with the same capacitance. By this means, all of sampling capacitor sets equal and the design becomes easy.

The disclosure of Japanese Patent Application No. 2006-105974, filed on Apr. 7, 2006, including the specification, drawings and abstract, is incorporated herein by reference in its entirety.

INDUSTRIAL APPLICABILITY

The present invention has an advantage of realizing steep and flexible filter characteristics and is preferably applicable to, for example, filter apparatuses using switched capacitors.

The invention claimed is:

1. A filter apparatus, comprising:
   a radio frequency converter that converts a radio frequency signal to current;
   a plurality of sampling capacitors that accumulate the current as a charge;
   a reader that reads a voltage from the plurality of sampling capacitors;
   positive polarity reading selectors that connect terminals of one side of the plurality of sampling capacitors to the reading section;
   negative polarity reading selectors that connect terminals of an other side of the plurality of sampling capacitors to the reading section;
   negative polarity ground connectors that connect the terminals of the one side of the plurality of sampling capacitors to a common ground;
   positive polarity ground connectors that connect the terminal of the other side of the plurality of sampling capacitors to the common ground; and
   a timing controller that outputs a control signal to each of the positive polarity reading selectors, the negative polarity reading selectors, the negative polarity ground connectors, and the positive polarity ground connectors, and that controls operation timing of each of the positive polarity reading selectors, the negative polarity reading selectors, the negative polarity ground connectors, and the positive polarity ground connectors.

2. The filter apparatus according to claim 1, wherein the plurality of sampling capacitors are grouped into a plurality of sampling capacitor sets, each sampling capacitor set being formed with a plurality of sampling capacitors, and accumulate the charge on a per sampling capacitor set basis.

3. The filter apparatus according to claim 2, wherein a total capacitance of the plurality of sampling capacitors is the same between the plurality of sampling capacitor sets.

4. The filter apparatus according to claim 2, wherein each sampling capacitor set is formed with a same number of sampling capacitors.

5. The filter apparatus according to claim 2, wherein each sampling capacitor set is formed with sampling capacitors of the same capacitance.

6. The filter apparatus according to claim 2, wherein the plurality of sampling capacitor sets are formed with a same number of sampling capacitors of a same capacitance.

7. The filter apparatus according to claim 6, wherein the plurality of sampling capacitor sets is one larger than the plurality of sampling capacitors forming one sampling capacitor set.

8. The filter apparatus according to claim 6, wherein the plurality of sampling capacitors forming the plurality of sampling capacitor sets is equal to a number of taps of a finite impulse response filter.

9. The filter apparatus according to claim 8, wherein a ratio of capacitance between the plurality of sampling capacitors forming the plurality of sampling capacitor sets equals an absolute value of a ratio of weighting coefficients of tap coefficients of the finite impulse response filter.

10. The filter apparatus according to claim 2, wherein
    the filter apparatus reads the voltage from the plurality of sampling capacitors in a single read-out, and
    a combination of a plurality of selected sampling capacitors is different between a time of accumulating the charge and a time of reading out the charge.

11. The filter apparatus according to claim 10, wherein the plurality of sampling capacitors selected in the single read-out are selected one by one per sampling capacitor set where the charge is already accumulated.

12. The filter apparatus according to claim 1, wherein
to extract a negative charge from the sampling capacitors, the timing controller places the negative polarity ground connectors and the negative polarity reading selectors in operation upon reading the charge from the plurality of sampling capacitors.

13. The filter apparatus according to claim 12, wherein
a number of sampling capacitors forming a sampling capacitor set, which is a target of a single accumulation of the charge, equals a number of taps of a finite impulse response filter,
a ratio of capacitance between the sampling capacitors equals a ratio of absolute values of weighting coefficients of the finite impulse response filter, and
the plurality of sampling capacitor sets is one larger than the number of taps of the finite impulse response filter.

14. The filter apparatus according to claim 13, wherein
the number of sampling capacitors, which are targets in a single read-out, equals the number of taps of the finite impulse response filter, and
individual sampling capacitors are selected from the sampling capacitor sets other than the sampling capacitor set that accumulates the charge.

15. The filter apparatus according to claim 1, wherein at least one of the ground connectors and the reading selectors is a micro electro mechanical system switch.

16. The filter apparatus according to claim 1, further comprising
charging capacitor selecting switches that are connected to the terminals of the one side of the plurality of sampling capacitors, wherein
at a first time, the timing controller accumulates change in the plurality of sampling capacitors through the terminals of one side of the plurality of sampling capacitors by placing the positive polarity ground connection switches and the charging capacitors selecting switches in operation, and
at a second time, the timing controller extracts negative charge through the terminals of the other side of the plurality of sampling capacitors by placing the negative polarity ground connection switches and the negative polarity reading selection switches in operation.

17. The filter apparatus according to claim 1, wherein the positive polarity reading selectors are switches.

18. The filter apparatus according to claim 17, wherein the negative polarity reading selectors are switches.

19. The filter apparatus according to claim 18, wherein the negative polarity ground connectors are switches.

20. The filter apparatus according to claim 19, wherein positive polarity ground connectors are switches.

* * * * *